(12) United States Patent
Yap

(10) Patent No.: US 10,020,331 B1
(45) Date of Patent: Jul. 10, 2018

(54) DUAL-BAND LATERAL-EFFECT POSITION SENSOR

(71) Applicant: HRL Laboratories, LLC, Malibu, CA (US)

(72) Inventor: Daniel Yap, Newbury Park, CA (US)

(73) Assignee: HRL Laboratories, LLC, Malibu, CA (US)

( * ) Notice: Subject to any disclaimer, the term of this patent is extended or adjusted under 35 U.S.C. 154(b) by 0 days.

(21) Appl. No.: 15/216,684

(22) Filed: Jul. 21, 2016

(51) Int. Cl.
G01J 5/20 (2006.01)
H01L 27/144 (2006.01)
H01L 31/0304 (2006.01)
H01L 31/0224 (2006.01)
H01L 31/0352 (2006.01)
H01L 31/101 (2006.01)

(52) U.S. Cl.
CPC .. *H01L 27/1443* (2013.01); *H01L 31/022408* (2013.01); *H01L 31/03046* (2013.01); *H01L 31/035281* (2013.01); *H01L 31/1013* (2013.01); *H01L 31/1016* (2013.01)

(58) Field of Classification Search
CPC ......... G01J 5/20; G01J 5/08; H01L 27/14649; H01L 31/09; H04N 5/33
See application file for complete search history.

(56) References Cited

U.S. PATENT DOCUMENTS

| 4,183,035 A | 1/1980 | Wang et al. |
| 4,496,788 A | 1/1985 | Hamakawa et al. |
| 4,675,525 A | 6/1987 | Amingual et al. |
| 5,080,725 A | 1/1992 | Green et al. |
| 5,239,179 A | 8/1993 | Baker |
| 5,581,084 A | 12/1996 | Chapman et al. |
| 5,721,429 A | 2/1998 | Radford et al. |
| 5,963,790 A | 10/1999 | Matsuno et al. |
| 5,977,557 A | 11/1999 | Kim |
| 6,294,723 B2 | 9/2001 | Uematsu et al. |

(Continued)

FOREIGN PATENT DOCUMENTS

JP 05259427 A 10/1993

OTHER PUBLICATIONS

U.S. Appl. No. 14/214,004, filed Mar. 14, 2014, D. Yap et. al.

(Continued)

*Primary Examiner* — David Porta
*Assistant Examiner* — Mamadou Faye
(74) *Attorney, Agent, or Firm* — Ladas & Parry

(57) ABSTRACT

Systems and methods for a multi-band position sensor and a multi-band optical detector are disclosed. This system comprises a dual-axis, lateral-effect position sensor for locating spots of light that has energy in two wavelength bands. This sensor senses the time-varying intensities of the light in each of the two wavelength bands. This sensor also provides the location of the spot of light on the light-detecting plane of the sensor. Examples are provided for light of two mid-wave infrared (MWIR) wavelength bands or of a short-wave infrared (SWIR) and a MWIR band. This sensor approach, could be applied to detect light of other wavelength bands, such as a combination of a MWIR and a long-wave infrared (LWIR) band. This concept is extended to an array of detectors for multi-band optical detection and multi-source location and tracking. Monolithic chip level fabrication of the multi-band detectors is also discussed.

46 Claims, 12 Drawing Sheets

(56) References Cited

U.S. PATENT DOCUMENTS

| | | | |
|---|---|---|---|
| 6,545,289 B1 | 4/2003 | Gunapala et al. | |
| 6,852,920 B2 | 2/2005 | Sager et al. | |
| 6,858,462 B2 | 2/2005 | Zaidi et al. | |
| 7,545,051 B2 | 6/2009 | Yang et al. | |
| 7,928,389 B1* | 4/2011 | Yap | H01L 31/0236 250/338.4 |
| 8,969,986 B1* | 3/2015 | Yap | H01L 31/0236 257/432 |
| 9,490,292 B1* | 11/2016 | Yap | H01L 27/14652 |
| 2002/0135869 A1 | 9/2002 | Banish et al. | |
| 2004/0045932 A1 | 3/2004 | Kochergin et al. | |
| 2005/0109388 A1 | 5/2005 | Murakami et al. | |
| 2006/0251995 A1 | 11/2006 | Wille et al. | |
| 2008/0072958 A1 | 3/2008 | Dutta | |
| 2009/0315136 A1* | 12/2009 | Hayashi | H01L 27/14647 257/440 |
| 2012/0037957 A1* | 2/2012 | Miller | H01L 21/02392 257/191 |
| 2015/0177381 A1* | 6/2015 | Yap | G01S 17/42 356/138 |
| 2017/0155011 A1* | 6/2017 | de Lyon | H01L 31/109 |

OTHER PUBLICATIONS

U.S. Appl. No. 14/214,139, filed Mar. 14, 2014, D. Yap et. al.

I. Hirsh, et al., "Hybrid dual-color MWIR detector for airborne missile warning systems," Proceeding of SPIE vol. 8353, paper 83530H (2012).

T. Svensson, et al., "A multispectral, high-speed, low-cost device in the UV-MWIR spectral range," SPIE—vol. 8167 pp. 25-1 through 25-9 (2011).

R. Richwine, et al., "A HgCdTe detector/FPA/sensor model for evaluation of VLWIR to SWIR sensors with an assessment of SWIR sensors for strategic and tactical missions," Proceedings of SPIE vol. 6294, paper 62940E (2006).

A. D. Devir, et al., "Fast multi-channel radiometer for diagnosing munitions flashes," Proceeding of SPIE vol. 6940, paper 69401O (2008).

H. Sharifi, et al., "Fabrication of high operating temperature (HOT), visible to MWIR, nCBn photon-trap detector arrays," Proceeding of SPIE vol. 8704, paper 87041U (2013).

A. I. D'Souza, et al., "MWIR InAsl-xSbx nCBn detectors data and analysis," Proceeding of SPIE vol. 8353, paper 835333 (2012).

R. Wolfshagen, et al., "HgCdTe position sensitive detector (PSD) development," Proceedings of SPIE vol. 7660, paper 76600H (2010).

Notice of Allowance for U.S. Appl. No. 14/214,004 (now U.S. Pat. No. 9,490,292 ) dated Jul. 6, 2016.

Notice of Allowance for U.S. Appl. No. 14/214,004 (now U.S. Pat. No. 9,490,292 ) dated Mar. 15, 2016.

Tokranova, N., et al.,"Hybrid Solar Cells Based on Organic Materials Embedded Into Porous Silicon," Proc. SPIE, vol. 5724, pp. 183-190 (2005).

Technical Information document (SD-12), "Characteristics and use of Infrared detectors", by Hamamatsu Photonics K. K, pp. 1-43 (2004).

A. Rogalski. "Quantum well photoconductors in infrared detector technology" Journal of Applied Physics, vol. 93, No. 8, pp. 4355-4391 (2003).

Green, M.A., et al. "Very High Efficiency Silicon Solar Cells—Science and Technology," IEEE Transactions on Electron Devices, vol. 46, No. 10, pp. 1940-1947 (1999).

Campbell, P., et al., "Light Trapping Properties of Pyramidally Textured Surfaces," J. Appl. Phys., vol. 62.1, American Institute of Physics, pp. 243-249 (1987).

Brendel, R., et al., "Ultrathin crystalline silicon solar cells on glass substrates," Applied Physics Letters, vol. 70, No. 3, pp. 390-392 (1997).

Swanson, R. M., et al. "Point-contact silicon solar cells," IEEE Transactions on Electron Devices, vol. ED-31, No. 5, pp. 661-664 (1984).

Sinton, R.A., et al., "27.5 percent silicon concentrator solar cells," IEEE Electron Device Letters, vol. EDL-7 No. 10, pp. 567-569 (1986).

Yuan, H., et al., "FPA Development: from InGaAs, InSb, to HgCdTe," Proceedings of SPIE vol. 6940, paper 694030, pp. 1-12, (2008).

Ashley, T., at al., "Epitaxial InSb for elevated temperature operation of large IR focal plane arrays," Proceedings of SPIE vol. 5074, pp. 95-102 (2003).

Zhao,. et at. "A 19.8% efficiency honeycomb multicrystalline silicon solar cell with . . . ," IEEE Transactions on Electron Devices, vol. 46, No. 10, pp. 1978-1983 (1999).

Kayes, B. M., et al., "Comparison of the device physics principles of planar and radial p-n junction nanorod solar cells" J. Appl. Physics, vol. 97, pp. 114302-1 to 11 (2005).

Hu, L.., et al., "Analysis of Optical Absorption in Silicon Nanowire Arrays for Photovoltaic Applications," Nano Letters, vol. 7, No. 11, p. 3249-3252 (2007).

Klipstein. P., "'XBn' barrier photodetector for high sensitivity and high operating temperature Infrared Sensors ," Proceedings of SPIE, vol. 6940, paper 69402U-1, pp. 1-12 (2008).

* cited by examiner

DUAL-BAND LATERAL-EFFECT POSITION SENSOR

TECHNICAL FIELD

The present disclosure is directed in general to the field of optical sensors and in particular to dual band light sensors and position sensors.

BACKGROUND OF THE DISCLOSURE

There is a compelling need in the field of optical sensors for a fast response dual band position sensor that can detect energy in two different spectral bands, are fast enough to track time varying intensities of light, and at the same time can track the location of the source of the light as that source moves at high velocities. Such a need exists for both commercial and military applications.

A variety of optical position sensors are known. Some of these include sensor systems that can locate the spot of illumination using imaging cameras, but suffer from a relatively slow response time. Some of the sensor systems sense multiple spectral bands by using multiple cameras to view the scene, with a different camera sensing each of the spectral bands. These systems are much larger and more complex, and the images they produce must be spatially aligned with each other. Because of their slow response, these imaging cameras cannot distinguish between the flashes that are characteristics of different small-caliber weapons.

Prior position sensing detectors, such as lateral-effect position sensing detectors, can have fast response and provide information on the location of a spot of light. However, these detectors cannot distinguish between multiple spectral bands. The existing sensors that cover a larger field of view often require large and slow mechanical gimbals to move their narrow field of view (FOV) detectors.

SUMMARY OF THE DISCLOSURE

To address one or more of the above-deficiencies of the prior art, one embodiment described in this disclosure provides for a dual-axis, lateral-effect position sensor for locating spots of light that has energy in two wavelength bands. This sensor senses the time-varying intensities of the light in each of the two wavelength bands. This sensor also provides the location of the spot of light on the light-detecting plane of the sensor.

An embodiment of the sensor comprises a detector that has two absorber regions, a first region absorbing light of the first wavelength band and a second region absorbing light of the second wavelength band, with each absorbing region generating holes and electrons associated with the light absorbed in each band. The detector has an energy barrier that blocks the flow of one electrical carrier type (i.e., blocking either the holes or the electrons) but that permits the flow of the other carrier type. The detector has a first pair of electrodes, which are located on opposite sides of the detector, that produce output currents associated with the blocked carrier type associated with absorbed light of the first wavelength band. The detector also has a second pair of electrodes, which are located on opposite sides of the detector, that produce output currents associated with the blocked carrier type associated with absorbed light of the second wavelength band. The detector also has a fifth electrode that produces an output current associated with the unblocked carrier type associated with absorbed light of both wavelength bands. In some embodiments, this fifth electrode provides a common or return path for the electrical currents generated from absorption of the light. The first pair of electrodes is located on different sides of the detector from the second pair of electrodes. In an embodiment of the detector, the detector has a square or a rectangular shape and the four electrodes of the two pairs of electrodes are located on the four sides of the detector.

Some embodiments of the sensor make use of the fact that the dual-band light of the spot illuminating the detector and whose position is to be determined is produced by the same source. Thus, at least for a part of the time interval when the spot is illuminating the detector, that spot comprises light of both wavelength bands. When both wavelengths of light are in the illuminating spot, the sensor can determine the position of the spot in both orthogonal directions defined by the detector. The detector, in combination with a signal-processing circuit, also provides outputs associated with the time-varying intensities of the light in each of the two wavelength bands.

In some embodiments, the sensor further comprises a signal-processing circuit. This circuit amplifies the photo-currents associated with the absorbed light. For each of two directions defined by the detector, this circuit determines a difference value associated with the photocurrents from the electrodes of a pair of electrodes and a sum value associated with the photocurrents from the electrodes of that same pair of electrodes. This circuit then determines a location value for the spot of light along that direction, for example, by dividing the difference value by the sum value. The sum value for each electrode pair, which could vary with time, indicates the intensity of the absorbed light in the band associated with that electrode pair. In some embodiments, the circuit also has a switch associated with each electrode pair that suppresses the output of the location value when the sum value for that electrode pair is below a threshold set-point.

In one embodiment of the detector, the barrier blocks the flow of holes between the two absorber regions. For that embodiment, the photo-generated hole-currents are used to determine the location of the spot. In another embodiment, the barrier blocks the flow of electrons between the two absorber regions. For that embodiment, the photo-generated electron-currents are used to determine the location of the spot.

Examples are provided for light of two mid-wave infrared (MWIR) wavelength bands or of a short-wave infrared (SWIR) and a MWIR band. This sensor approach, could be applied to detect light of other wavelength bands, such as a combination of a MWIR and a long-wave infrared (LWIR) band. This concept is extended to an array of detectors for multi-band optical detection and multi-source location and tracking. Monolithic chip level fabrication of the multi-band detectors are also discussed.

Certain embodiments may provide various technical features depending on the implementation. For example, a technical feature of some embodiments may include the capability to provide position sensing while other embodiments provide for multi-band optical detection.

Although specific features have been enumerated above, various embodiments may include some, none, or all of the enumerated features. Additionally, other technical features may become readily apparent to one of ordinary skill in the art after review of the following figures and description.

BRIEF DESCRIPTION OF THE DRAWINGS

For a more complete understanding of the present disclosure and its features, reference is now made to the following description taken in conjunction with the accompanying drawings, in which like reference numerals represent like parts.

DETAILED DESCRIPTION

It should be understood at the outset that, although exemplary embodiments are illustrated below, the present invention may be implemented using any number of techniques, whether currently known or not. The present invention should in no way be limited to the examples, implementations, drawings, and techniques illustrated below. Additionally, the drawings are not necessarily drawn to scale.

Figure 1A:
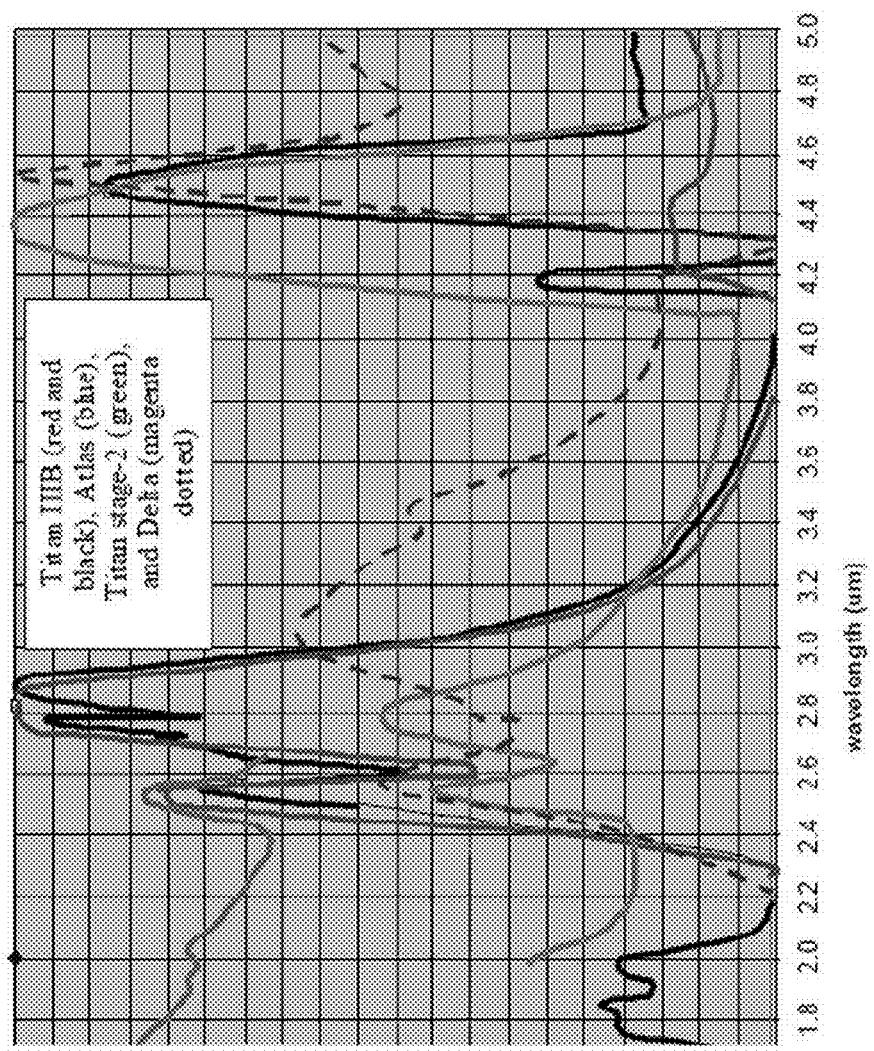
FIG. 1a and FIG. 1b illustrate examples of spectral emission from the plume of various rockets.
Figure 1B:
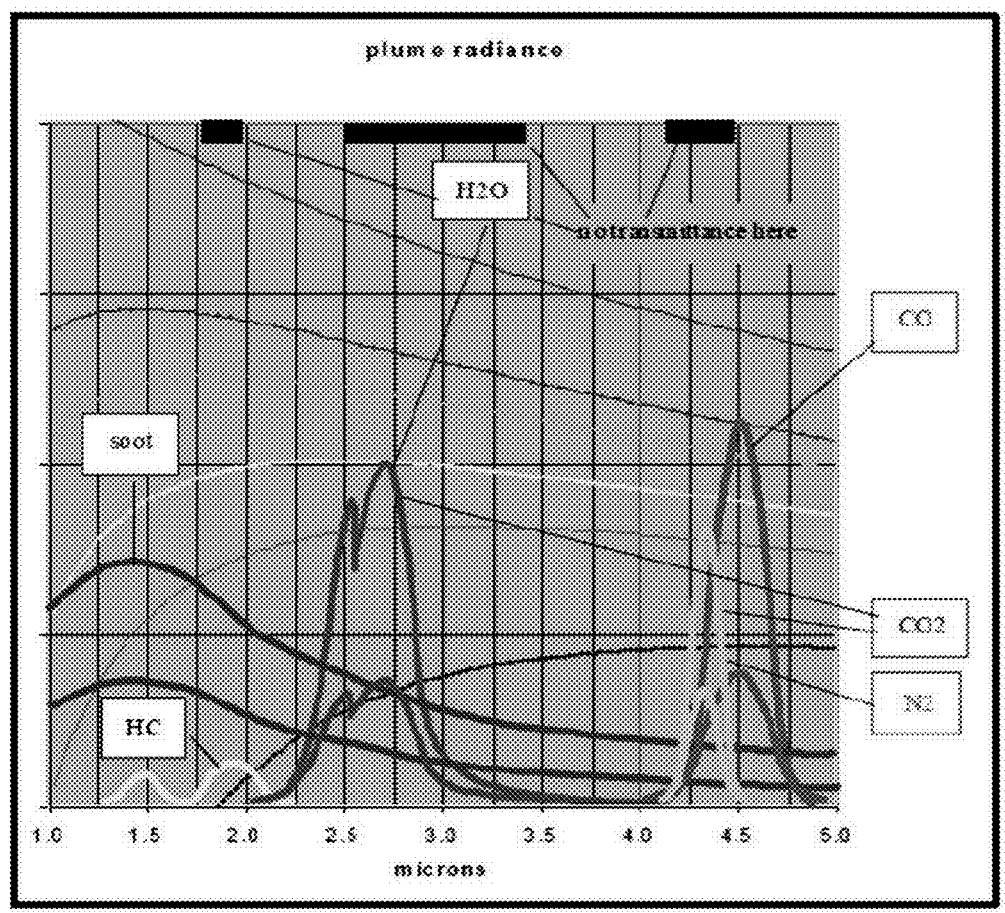

Multi-wavelength observation of the light emitted from an object can be useful for determining the temperature of the object, since the spectral shape of its black-body radiation depends on its temperature. Also, the light from an object can be produced by other effects such as emission due to chemical reaction products. FIG. 1a illustrates an example of the emission spectra of the plume from various rockets and FIG. 1b illustrates the emission spectra of the chemical products associated with various spectral features. FIGS. 1a and 1b illustrates that the comparison of the intensities of light in two different wavelength bands such as the SWIR band of 2.0-2.5 µm, the MWIR band of 3.4-4.1 µm or the MWIR band of 4.5-5.0 µm can enable one to distinguish between different sources of a plume.

Figure 2A:
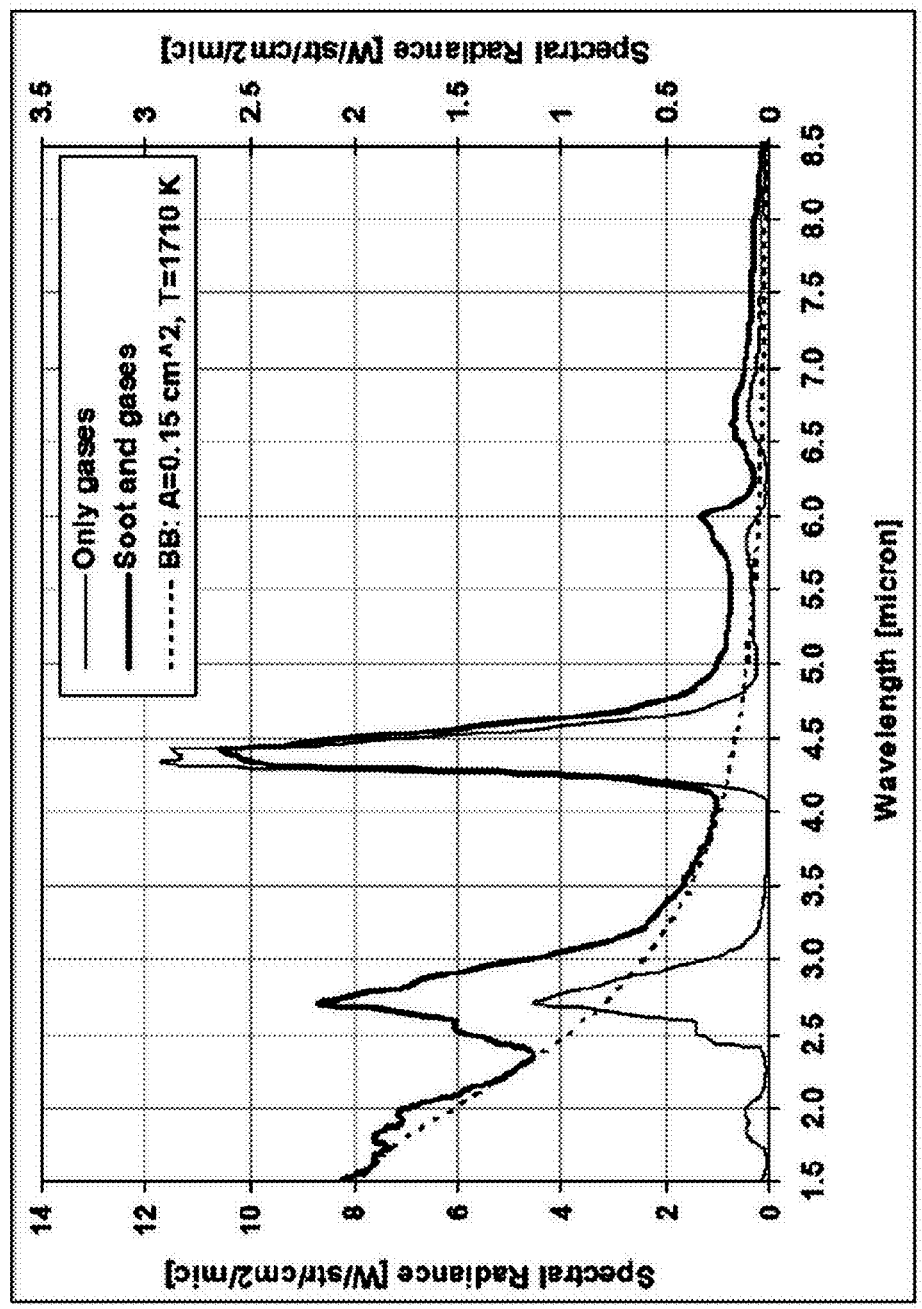
FIG. 2a and FIG. 2b illustrate an example of the spectral and time dependence of light emitted from a gunshot.
Figure 2B:
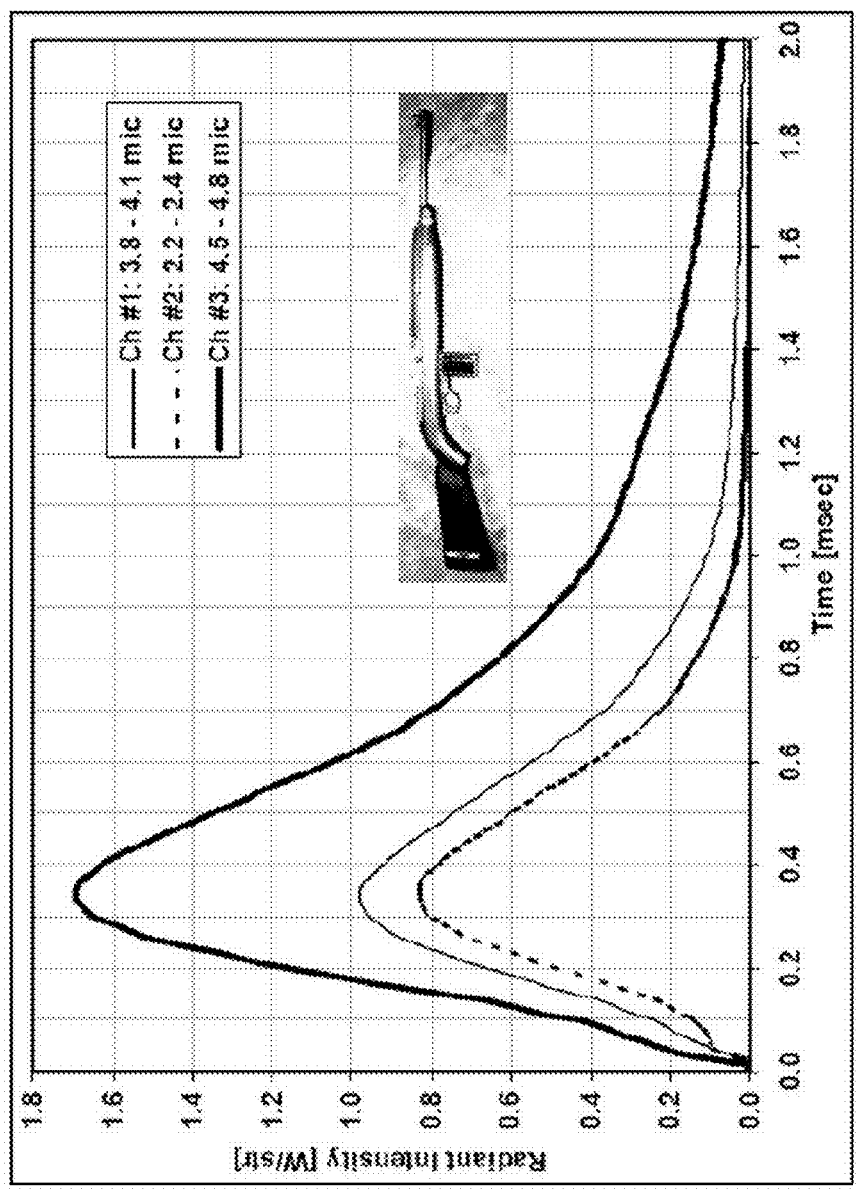

FIG. 2a illustrates the spectral emission of a blast from a gunshot. The emitted light has spectral components due to the gases produced by the gunshot and also spectral components due to the hot soot produced. Different weapons have different ratios of the chemical versus temperature components of the emitted spectrum. Also, these spectral components could have different time variations for different weapons. An example of the time varying light of the blast from a weapon is illustrated in FIG. 2b for several spectral components.

An embodiment of the disclosed sensor includes a lateral-effect position sensing detector (LEPSD). The LEPSD can detect the location of a spot of light that illuminates the detector. In general, the size of that spot of light is smaller than the size of the detector. When used in a sensor, the LEPSD is coupled to a lens that focuses input light from a distant source onto the LEPSD. This assembly can sense the angle-of-arrival of the light, which illuminates the lens and which is projected as a spot onto the LEPSD. Thus, the LEPSD can be used to locate the source of the light. As discussed above, it is helpful in some cases to be able to distinguish between different spectral components of the light from a distant source. A LEPSD sensor that can detect light in two wavelength bands, that can provide the time-variation of the two spectral components of light and that can locate the source of that light is useful for identifying, locating and tracking the motion of sources such as rockets, projectiles and gunshots.

Figure 3:
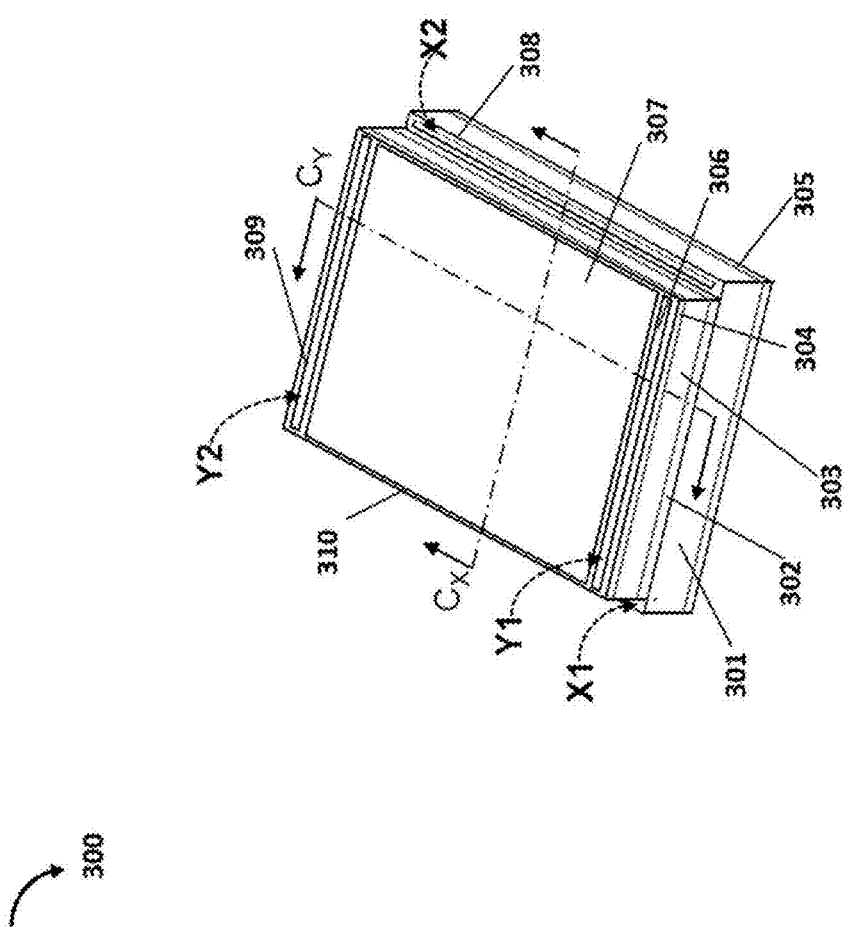
FIG. 3 is an Illustration of a dual-band lateral effect position sensing according to an embodiment of the present disclosure.

FIG. 3 illustrates a schematic depiction of a dual-band lateral-effect position sensing detector 300. In typical operation, a spatially non-uniform intensity distribution of light is incident upon a side (or face) of the LEPSD. This light intensity distribution may resemble a focused or nearly focused spot of light, whose size is much smaller than the size of the LEPSD. The LEPSD has four signal contacts (306, 308, 309 and 310) with each contact producing an output photo-current. The LEPSD also has a common contact 307 that produces a return photo-current that is equal to the sum of the photo-current from the other four contacts. The collector 304 serves to collect the return current and coupled that current to the common contact 307. The LEPSD has two absorber regions—Absorber 1 (301) and Absorber 2 (303)—that are separated by a barrier layer 302. These two absorber regions 301 and 303 selectively absorb the two wavelength bands of the incident light. When the incident light is absorbed in an absorber region, each photon of incident light can result in the generation of an electron charge-carrier and a hole charge-carrier. The barrier layer 302 selectively blocks the flow of one carrier type (e.g., either the electrons or the holes) and permits the flow of the other carrier type. FIG. 3 illustrates an example of a LEPSD that provides location in regards to two orthogonal axes of X and Y. As depicted in FIG. 3, two contacts X1 310 and X2 308 are coupled to the first absorber layer (Absorber 1) and two contacts Y1 306 and Y2 309 are coupled to the second absorber layer (Absorber 2). The incident light illuminates the detector from the side closer to Absorber 1. Buffer 305 is of suitable material to pass the light through it to Absorber 1. Light of the shorter-wavelength band (i.e., Band 1) sensed by this detector is absorbed in Absorber 1. Light of the longer-wavelength band (i.e., Band 2) sensed by this detector passes through Absorber 1 and is absorbed in Absorber 2. For the example illustrated, the side of the detector closer to Absorber 2 and farther from the incident light has a common contact 307 that also can serve as an optical reflector of the light illuminating the detector and passing through the detector layers. The reflector allows that longer-wavelength light to make two passes through Absorber 2 so that the thickness of Absorber 2 can be smaller and still absorb the same amount of light as a thicker absorber. In some embodiments, the signal contacts are accessed from the side of the detector closer to Absorber 2, as illustrated in the FIG. 3. However, in other embodiments of the detector, the signal contacts are accessed from the side of the detector closer to Absorber 1.

System 400a in FIG. 4a illustrates the electronic function of the dual-band LEPSD, in the form of an equivalent electrical circuit. Each of the two absorber layers generates a photo-current that is proportional to the intensity of the light of the associated wavelength band. The light is in a spot that is smaller than the size of the detector. Thus, the photo-currents are produced in only a portion of the detector area. For the photo-current associated with each of the two wavelength bands (e.g., $I_{P1}$ or $I_{P2}$), the current flows to two contacts (e.g., X1 and X2 or Y1 and Y2, respectively) that are located on opposite sides of the detector and that are associated with the absorber region for that wavelength band. The detector acts like a resistive divider for this current. The resistances (e.g., $R_{X1}$ and $R_{X2}$ or $R_{Y1}$ and $R_{Y2}$) depend on the distance from the location of the spot of light to the contact. The resistance (e.g., $R_{X1}$) is smaller when the spot is closer to the contact (e.g., X1).

System 400b in FIG. 4b illustrates the function of an electronic signal-processing circuit that is coupled to the dual-band LEPSD. When a spot of light is incident upon the LEPSD, photo-currents can be produced at the four contacts—X1, X2, Y1 and Y2—which are the electrical outputs of the LEPSD. The four photo-currents—$I_{1X1}$, $I_{1X2}$, $I_{2Y1}$ and $I_{2Y2}$—are derived from the photo-currents $I_{P1}$ and $I_{P2}$ resulting from absorption of the incident light by absorber regions Absorber 1 and Absorber 2, respectively. Contacts X1 and X2 are configured to determine the offset or relative displacement of the spot of incident light (or the centroid of the illumination pattern) from the center of the detector along the x-axis. Contacts Y1 and Y2 are configured to determine the offset or relative displacement of the spot of incident light (or the centroid of the illumination pattern) from the center of the detector along the y-axis. The position of the illuminated spot X(t) and Y(t) is determined by processing the four photo-currents as indicated by the following equations:

$$X(t) = K_X \frac{I_{X2} - I_{X1}}{I_{X2} + I_{X1}}$$

$$Y(t) = K_Y \frac{I_{Y2} - I_{Y1}}{I_{Y2} + I_{Y1}}$$

In an exemplary embodiment, $K_X=L_X/2$ and $K_X=L_Y/2$, with $L_X$ and $L_Y$ being the nominal widths of the LEPSD (i.e., the distances between the oppositely located contacts) along the x-axis and along the y-axis, respectively. If the illuminated spot is located at the center of the LEPSD, values of zero are produced for the y-position offset and for the x-position offset. For this example, if the illuminated spot is located adjacent the contact Y2, the y-position offset would have a value of $+0.5L_Y$. And, if the illuminated spot is located adjacent the contact Y1, the y-position offset would have a value of $-0.5L_Y$. As the illuminated spot moves closer to contact Y2, the value of resistance $R_{Y2}$ becomes smaller and the value of resistance $R_{Y1}$ becomes larger. Likewise, as the illuminated spot moves closer to contact X1, the value of resistance $R_{X1}$ becomes smaller and the value of resistance $R_{X2}$ becomes larger. In the example depicted in this FIG. 42a, the positive photo-current $I_{P1}$ is divided through resistances $R_{X1}$ and $R_{X2}$ and the positive photocurrent $I_{P2}$ is divided through resistances $R_{Y1}$ and $R_{Y2}$ as shown below:

$$I_{Y2}=I_{P2} \cdot R_{Y1}/(R_{Y1}+R_{Y2}).$$

In one embodiment, the four output currents from the LEPSD are connected to trans-impedance amplifiers (TIAs), as illustrated in FIG. 4b. Various known circuit designs could be used for the TIAs. Also, various known circuit designs, such as those based on operational amplifiers, could be used to implement the subtracting operation, the summing operation and the dividing operation. In some designs, the signal provided to the denominator input of the dividing circuit should have a positive value. There is a separate set of operational amplifiers, subtracting circuitry, summing circuitry and dividing circuitry for each of the two photo-currents, $I_{P1}$ and $I_{P2}$. The circuitry associated with $I_{P1}$ produces the time-varying X-position offset X(t) from the center of the detector. The circuitry associated with $I_{P2}$ produces the time-varying Y-position offset Y(t) from the center of the detector. The summing circuitry for each photo-current, e.g., $I_{P1}$, produces an output waveform (e.g., $A_1 I_{P1}(t)$) that is related to the time-variation of that photo-current. The processing circuit for the LEPSD has four outputs. Two outputs provide the location of the dual-band illuminating spot, along two reference axes (e.g., X and Y). One other output provides the time-variation of light in the first wavelength band of the illuminating spot. Another output provides the time-variation of light in the second wavelength band of the illuminating spot.

Figure 5:
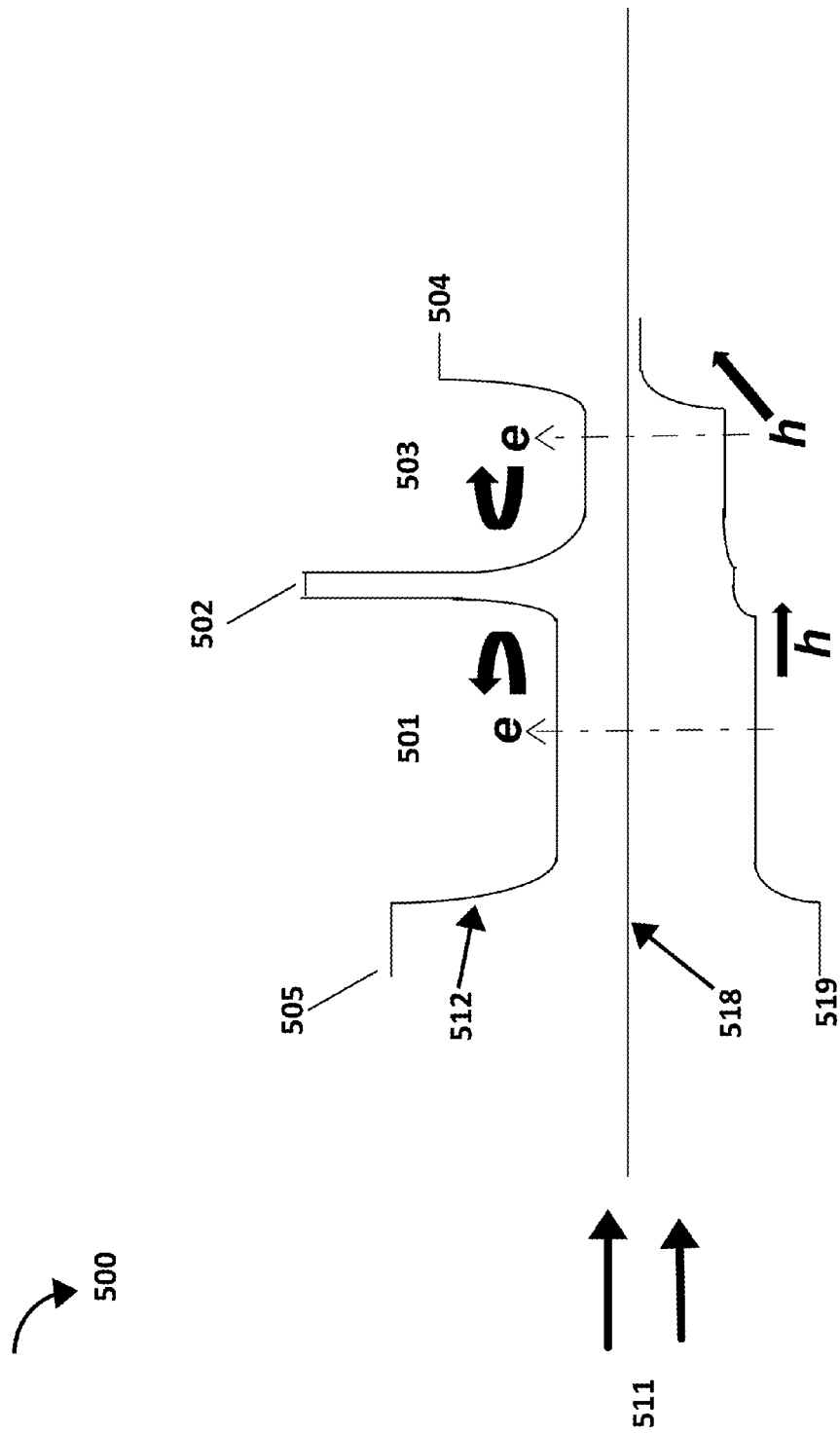
FIG. 5 illustrates an example of an electronic band structure for a dual-band detector, according to an embodiment of the present disclosure.

Another embodiment 500 in FIG. 5 illustrates a material structure for the LEPSD. For this example, Absorber 1 (501) absorbs from incident light 511, light of SWIR and MWIR bands that have wavelength between approximately 2 and 4 µm and Absorber 2 (503) absorbs light of a MWIR band that has wavelength shorter than 5 µm. Absorber 1 is transparent to the longer wavelength light having wavelength greater than the 4 µm cutoff of the Absorber 1 material. Thus, light having wavelength between 4 and 5 µm would be absorbed by Absorber 2 as well as any remaining light of 2 to 4 µm wavelength that passes through Absorber 1 without being absorbed. In an exemplary embodiment, Absorber 1 comprises n-type GaInAsSb and Absorber 2 comprises n-type InAsSb. These two absorber regions are separated by a p-type GaAlAsSb barrier layer 502 that imposes a high energy barrier in the conduction band to block the flow of electrons between the two absorber regions. That barrier layer 502, however, imposes no energy barrier or only a small energy barrier in the valence band to the flow of holes between the two absorber regions. In FIG. 5, 518 represents the Fermi level, 512 represents the edge of the conduction band and 519 represents the edge of the valence band. The material structure illustrated in FIG. 5 also has a buffer layer 505 located on the side of Absorber 1 that is opposite the side adjacent to the barrier layer. The energy bandgap of this buffer layer (i.e., the energy difference between the edges of the valence band and the conduction band) is sufficiently wide to pass light having wavelength longer than 2 µm, which would be detected by the detector. In an exemplary embodiment of the structure illustrated in FIG. 5, the buffer layer comprises p-type AlAsSb. The buffer layer imposes a barrier in the conduction band that blocks the flow of electrons from Absorber 1 into that buffer layer. Thus, those electrons generated as a result of light absorption in Absorber 1 remain in that absorber region and flow to the two electrical contacts coupled to Absorber 1. The buffer layer also imposes a barrier in the valence band that blocks the flow of holes from Absorber 1 into that buffer layer. But since the barrier layer between the two absorber regions does not block the flow of holes, those holes generated as a result of light absorption in Absorber 1 can flow into Absorber 2.

The material structure illustrated in FIG. 5 also has a p-type collector layer 504 located on the side of Absorber 2 that is opposite the side adjacent to the barrier layer 502 (and also opposite the side of the detector that has the buffer layer 505). The energy bandgap of this collector layer 504 (i.e., the energy difference between the edges of the valence band and the conduction band) is sufficiently wide to pass light having wavelength longer than 4.0 µm, which would be detected by Absorber 2 of the detector. However, the collector layer 504 could absorb light that otherwise would be absorbed by Absorber 1 if that light made a second pass through those regions. In an exemplary embodiment of the structure in FIG. 5, the collector layer 504 comprises p-type GaInAsSb. The collector layer imposes a barrier in the conduction band that blocks the flow of electrons from Absorber 2 into that collector layer. Thus, those electrons generated as a result of light absorption in Absorber 2 remain in that absorber region and flow to the two electrical contacts coupled to Absorber 2. The collector layer does not impose a barrier in the valence band but establishes a potential gradient that aids the flow of holes from Absorber 2 into that collector layer. Thus, those holes generated as a result of light absorption in Absorber 1 and in Absorber 2 can flow into the collector layer.

In an embodiment 600, FIG. 6a and FIG. 6b illustrates Cx and Cy cross-sectional views of the LEPSD of FIG. 5 for the X-position cross-section and for the Y-position cross-section, as viewed from cut lines drawn along the X-axis and along the Y-axis, respectively. These two cut lines are indicated in the illustration of FIG. 3 by Cx and Cy. The incident light is represented by 611, Band 1 absorber is 601, Band 2 absorber is 603, the Barrier layer is 602 and the Buffer layer is 605. The dielectric area is represented by 621 and the ion-implanted doping areas by 622. The bottom metal interconnects and pads are represented by 607. Two electrical signal contacts 608 and 610 located on opposite edges of the detector are coupled to the Band 1 absorber 601 (or Absorber 1). These two contacts (visible in the Cx view) extract the photo-generated electron currents resulting from absorption of the shorter-wavelength, Band V 1 light. Two other electrical signal contacts 606 and 609 located on opposite edges of the detector are coupled to the Band 2 absorber (or Absorber 2). These two contacts (visible in the Cy view) extract the photo-generated electron currents resulting from absorption of the longer-wavelength, Band 2 light. The relative levels of those four currents depend on the location of the illuminating spot of light, as discussed above with reference to FIGS. 4a and 4b.

Figure 4:
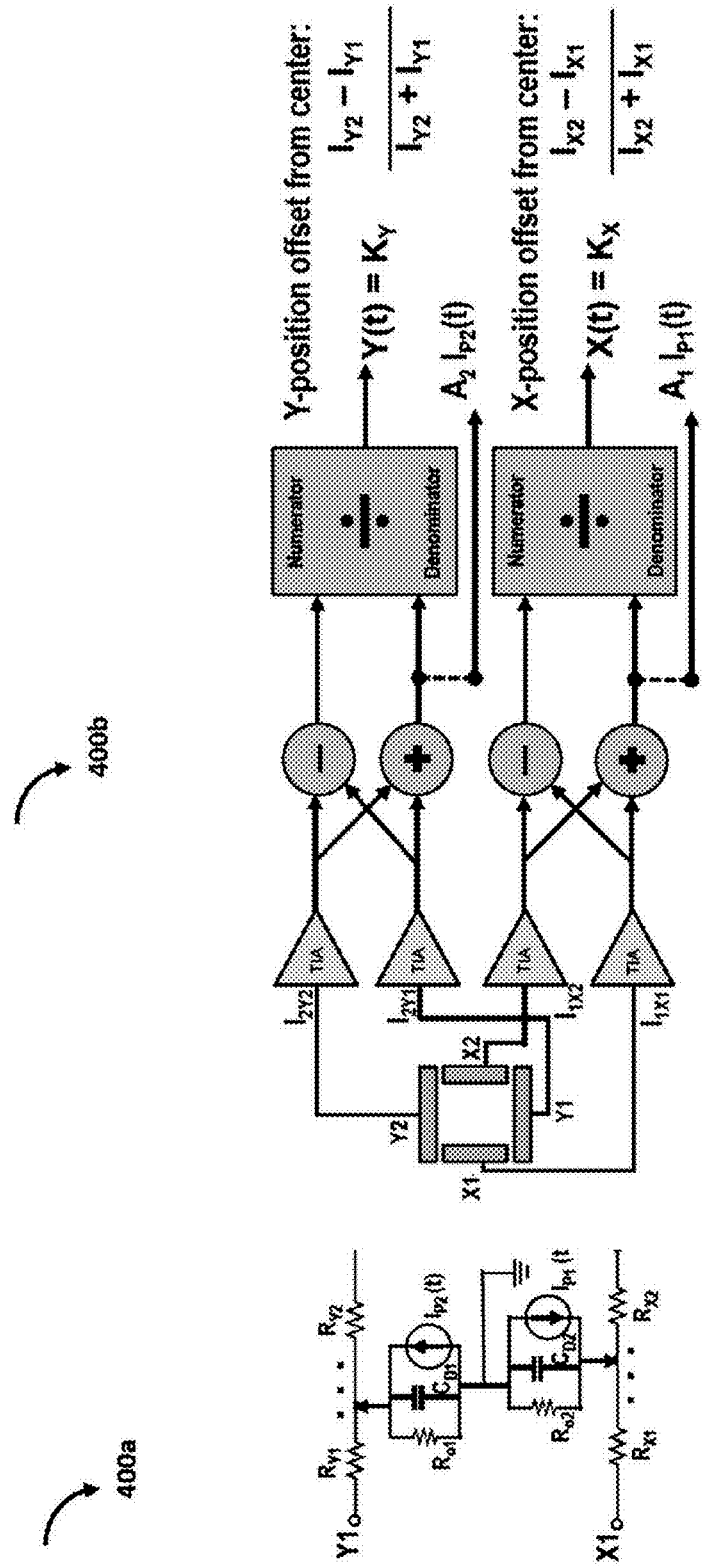
FIG. 4a illustrates a Lateral Effect Position Sensing Detector (LEPSD) equivalent circuit according to an embodiment of the present disclosure.
FIG. 4b illustrates its electronic interface circuit for 2-axis position determination and wavelength specific temporal output, according to an embodiment of the present disclosure.

Several electrical common contacts 607 located on the side of the detector opposite the side from which the light is incident are coupled to the collector layer 604. The collector layer can be separated into multiple collector regions, as illustrated in FIGS. 6a and 6b. The detector has a total of five electrical contact pads 613, 614, 615, 616 and 617 that are located on the back side of the device, which is the side opposite the side from which the light is incident. These pads can be electrically coupled to the electronic circuit, as illustrated in FIG. 4 and also with reference to FIG. 3. For example, contact pad 613 is electrically coupled to the X1 signal contact 610 and supplies current $I_{1X1}$ to the electronic circuit. Contact pad 614 is electrically coupled to the X2 signal contact 608 and supplies current $I_{1X2}$ to the electronic circuit. Contact pad 615 is electrically coupled to the Y1 signal contact 606 and supplies current $I_{2Y1}$ to the electronic circuit. Also, contact pad 616 is electrically coupled to the Y2 signal contact 609 and supplies current $I_{2Y2}$ to the electronic circuit. Contact pad 617 is electrically coupled to the common contacts 607 and provides a path for the return current (or ground) of the electronic circuit. The combined current from the common contacts 607 coupled to the multiple collector regions 604 equals the sum of the currents $I_{P1}$ and $I_{P2}$ respectively produced as a result of absorption of light by the Band 1 absorber 1 601 and coupled through contacts 610, 608 as well as absorption of light by the Band 2 absorber 2 603 and coupled through contacts 606, 609.

In some embodiments, these pads 613, 614, 615, 616 and 617 also can serve as optical reflectors that reflect the portion of Band 2 light which is not absorbed from one pass through the Band 2 absorber region (Absorber 2) back again through that absorber region to be absorbed, in a second pass. This two-pass operation allows the thickness of the Band 2 absorber region to be smaller.

Figure 7:
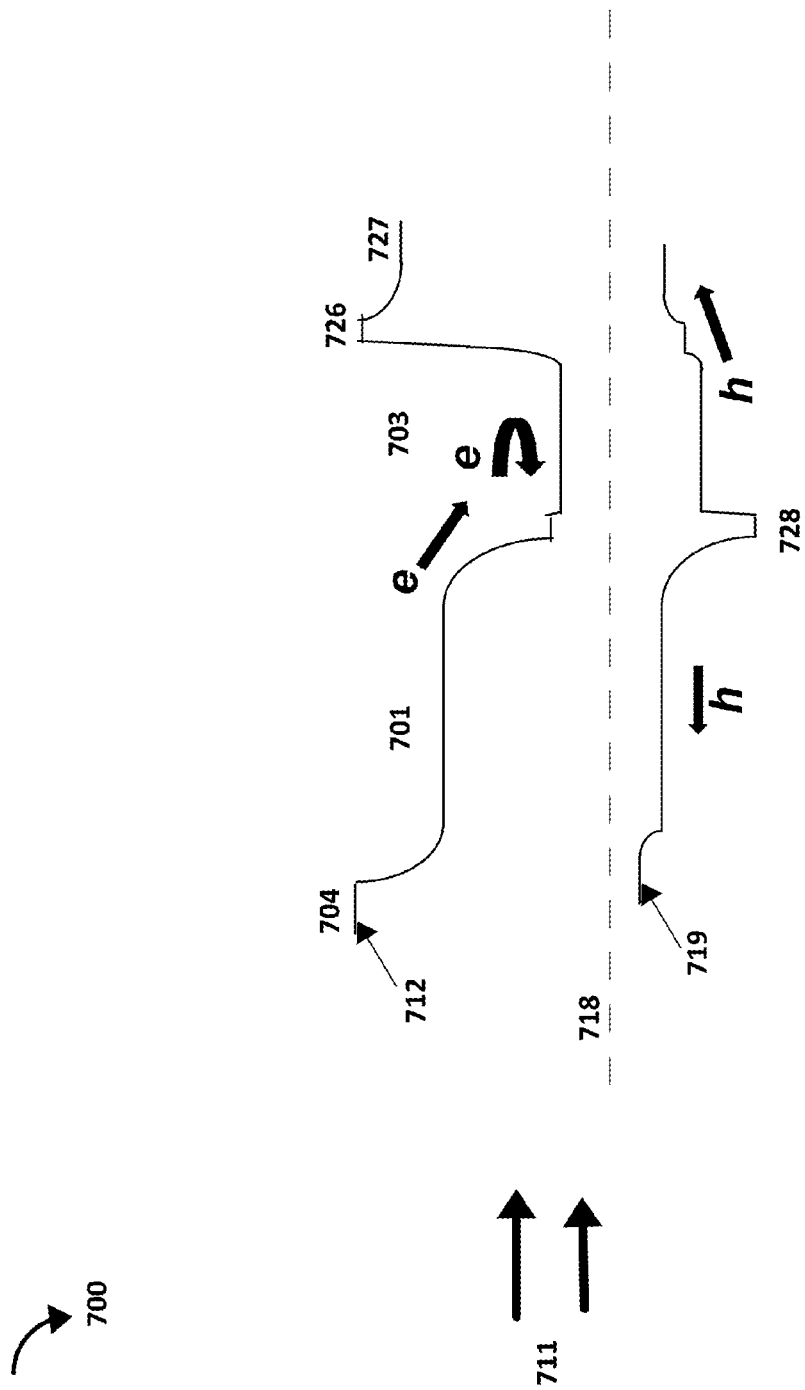
FIG. 7 illustrates an electronic band structure of a detector material, according to an embodiment of the present disclosure.

In another embodiment 700 illustrated in FIG. 7, the LEPSD is implemented with a different material structure. In this embodiment, the incident light is represented by 711, the band 1 absorber is represented by 701, the band 2 absorber by 703, the collector 1 by 704, the collector 2 by 727 and the barrier in the valence band by 728. An optional conduction band barrier is represented by 726. The conduction band edge for these various material layers is indicated by 712 and the valence band edge is indicated by 719 in the energy diagram shown in the figure. The Fermi level is illustrated by the dashed line 718. Like the embodiment 500, Absorber 1 absorbs light of SWIR and MWIR bands that have wavelength between approximately 2 and 4 µm and Absorber 2 absorbs light of a MWIR band that has wavelength shorter than 5 µm. Absorber 1 is transparent to the longer wavelength light having wavelength greater than the 4 µm cutoff of the Absorber 1 material. Thus, light having wavelength between 4 and 5 µm would be absorbed by Absorber 2 as well as any remaining light of 2 to 4 µm wavelength that passes through Absorber 1 without being absorbed. For the embodiment 700, the exemplary material for the Absorber 1 comprises p-type GaInAsSb and Absorber 2 comprises n-type InAsSb. These two absorber regions are separated by an n-type InAs barrier layer that imposes a sufficiently high energy barrier in the valence band to block the flow of holes between the two absorber regions. That barrier layer 728, however, imposes no energy barrier or only a small energy barrier in the conduction band to the flow of electrons between the two absorber regions. The energy structure facilitates the flow of electrons from Absorber 1 (701) into Absorber 2 (703).

The embodiment 700 illustrated in FIG. 7 also has a collector layer 704, Collector 1, located on the side of Absorber 1 that is opposite the side adjacent to the barrier layer 728. The energy bandgap of this collector layer is sufficiently wide to pass light having wavelength longer than 2 µm, which would be detected by the detector. For the embodiment 700, the exemplary material for Collector 1 comprises p-type GaAlAsSb. Alternatively, this collector layer also could comprise p-type AlInSb. This collector layer imposes a barrier in the conduction band that blocks the flow of electrons from Absorber 1 into Collector 1. Thus, those electrons generated as a result of light absorption in Absorber 1 remain in that absorber region or flow into Absorber 2. Collector 1 permits the flow of holes from Absorber 1 into that layer and collects those holes generated as a result of light absorption in Absorber 1.

The embodiment 700 also has a second p-type collector layer 727, Collector 2, located on the side of Absorber 2 (703) that is opposite the side adjacent to the barrier layer 728 (and also opposite the side of the detector that has the first collector layer 704, Collector 1). The energy bandgap of this second collector layer 727 (i.e., the energy difference between the edges of the valence band and the conduction band) is sufficiently wide to pass light having wavelength longer than 4 μm, which would be detected by Absorber 2 of the detector. However, this collector layer might absorb some shorter-wavelength light that otherwise would be absorbed by Absorber 1. In the exemplary structure, this collector layer comprises p-type AlInSb. Collector 2 (727) imposes a barrier in the conduction band that blocks the flow of electrons from Absorber 2 into that collector layer. Thus, those electrons generated as a result of light absorption in Absorber 2 remain in that absorber region and flow to electrical contacts coupled to Absorber 2. Collector 2 does not impose a barrier in the valence band but establishes a potential gradient that aids the flow of holes from Absorber 2 into that collector layer, which collects those holes generated as a result of light absorption in Absorber 2. An additional barrier layer 726 can be included in the material structure that further blocks the flow of electrons from Absorber 2 into the second collector layer 727 but does not impede the flow of holes from Absorber 2 into that collector layer.

System 800 illustrated in FIG. 8a and FIG. 8b illustrates Cx and Cy cross-sectional views of a detector embodiment that makes use of the material structure in the embodiment 700 (FIG. 7). Please refer to FIG. 3 for the cross-sectional cuts Cx and Cy. The incident light is represented by 811, the barrier by 828, the common contact areas by 807, the dielectric area by 821, and the ion implanted doping areas by 822. Two electrical signal contacts 808 and 810 located on opposite edges of the detector are coupled to the Band 1 absorber 801 (or Absorber 1) through Collector 1, 804. These two contacts (visible in the Cx view) extract the photo-generated electron currents resulting from absorption of the shorter-wavelength, Band 1 light. Two other electrical signal contacts 806 and 809 located on opposite edges of the detector are coupled to the Band 2 absorber 803 (or Absorber 2) through Collector 2, 827. These two contacts (visible in the Cy view) extract the photo-generated electron currents resulting from absorption of the longer-wavelength, Band 2 light. The relative levels of those four currents depend on the location of the illuminating spot of light, as discussed above with reference to FIGS. 4a and 4b.

Multiple electrical common contacts 807 located on the side of the detector opposite the side from which the light 811 is incident are coupled to Absorber 2 (803). The photo-generated electrons that are produced as a result of the absorption of the Band 1 light and the Band 2 light are extracted through these common contacts 807. Multiple via holes are formed in Collector 2 (827). These via holes are filled with metal posts 837 that conduct currents from the common contacts 807 to a metal pad 817 for the common current associated with absorption of light in both wavelength bands. The detector has a total of five electrical contact pads 813, 814, 815, 816 and 817 that are located on the back side of the device, which is the side opposite the side from which the light is incident. These pads can be electrically coupled to the electronic circuit, as illustrated in FIGS. 4a and 4b. These pads 813, 814, 815, 816 and 817 have the same electrical connections as the corresponding pads 613, 614, 615, 616 and 617 shown in FIGS. 6a and 6b. In some embodiments, these pads also can serve as optical reflectors that reflect the portion of Band 2 light which is not absorbed from one pass through the v Band 2 absorber region (Absorber 2) back again through that absorber region to be absorbed, in a second pass. This two-pass operation allows the thickness of the Band 2 absorber region to be smaller.

Figure 8:
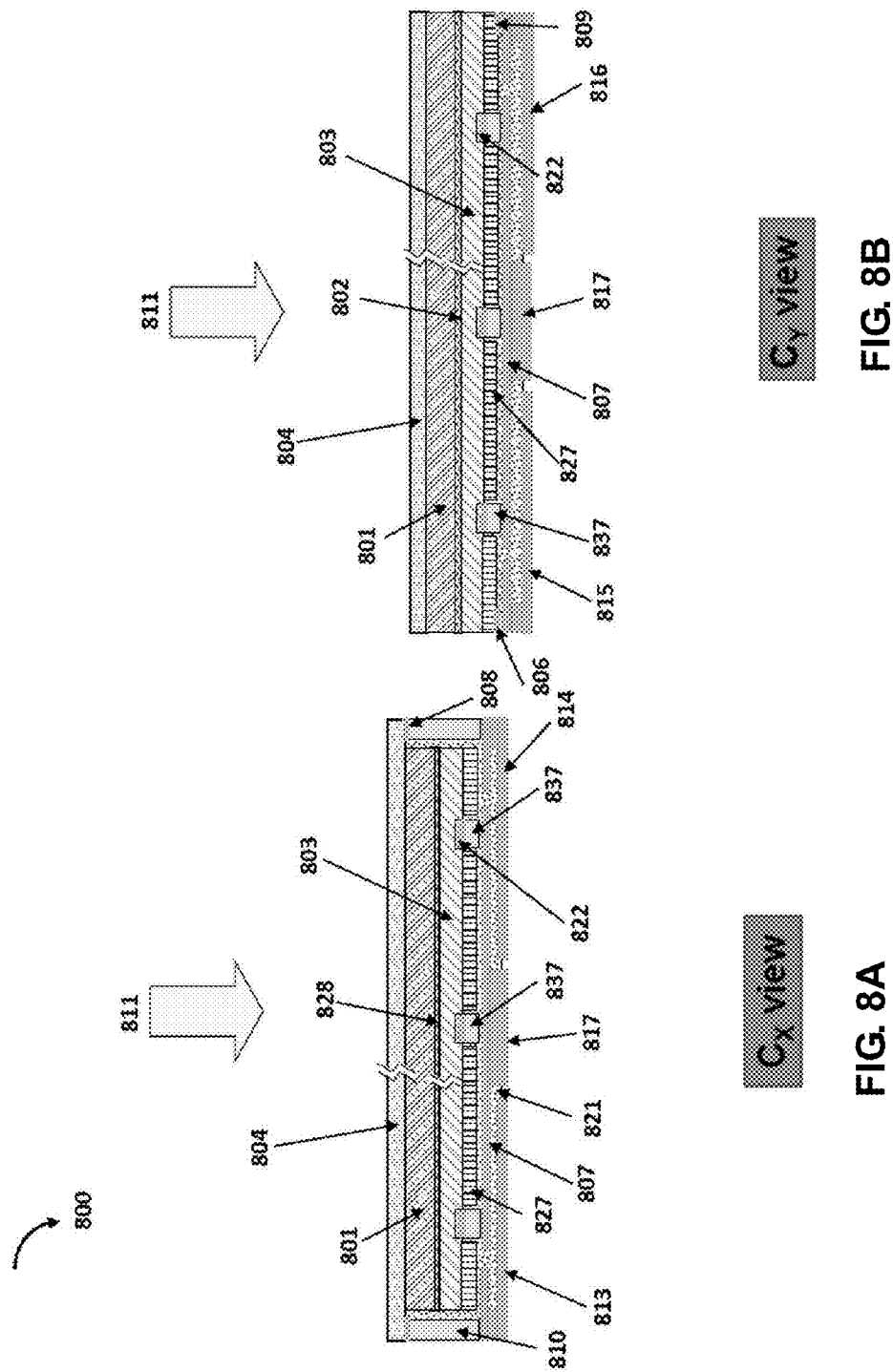
FIG. 8a and FIG. 8b illustrate Cx and Cy cross-sectional views of a detector, according to an embodiment of the present disclosure.
Figure 9:
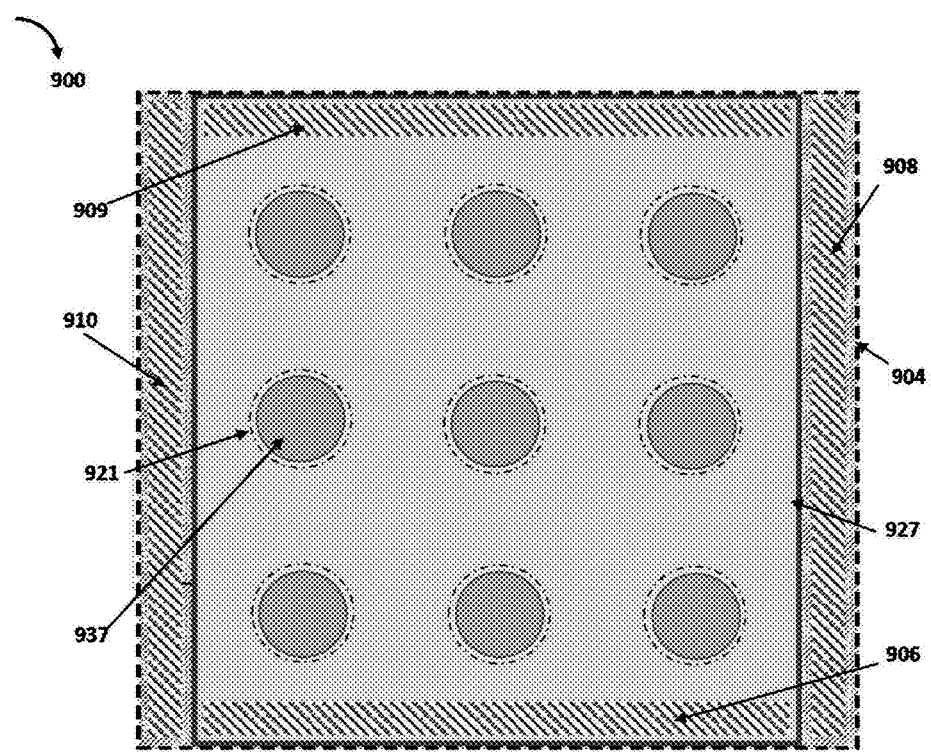
FIG. 9 illustrates an electrical contact pattern in a detector assembly, according to an embodiment of the present disclosure.

The embodiment 900 in FIG. 9 illustrates the pattern of electrical contacts made to the backside of the detector structure of FIGS. 7 and 8. The four signal contacts are located at the four edges of the detector. Two signal contacts 910, 908 are coupled to Collector 1 (904) and two other signal contacts 906, 909 are coupled to Collector 2 (927). Although via holes are formed in Collector 2, that collector layer 927 is still contiguous and provides paths for currents to flow to the two signal contacts coupled to that layer. Each metal post 937 in a via hole is in direct contact only with the Ohmic contacts formed in Absorber 2 and is separated from the material of Collector 2 by some dielectric material 921 filling the spaces in the via hole. The metal posts 937 in the via holes make contacts with the Band 2 absorber layer. The X1 and X2 contacts are represented by 910 and 908, respectively, while the Y1 and Y2 contacts are represented by 906 and 909, respectively, in FIG. 9.

Figure 6:
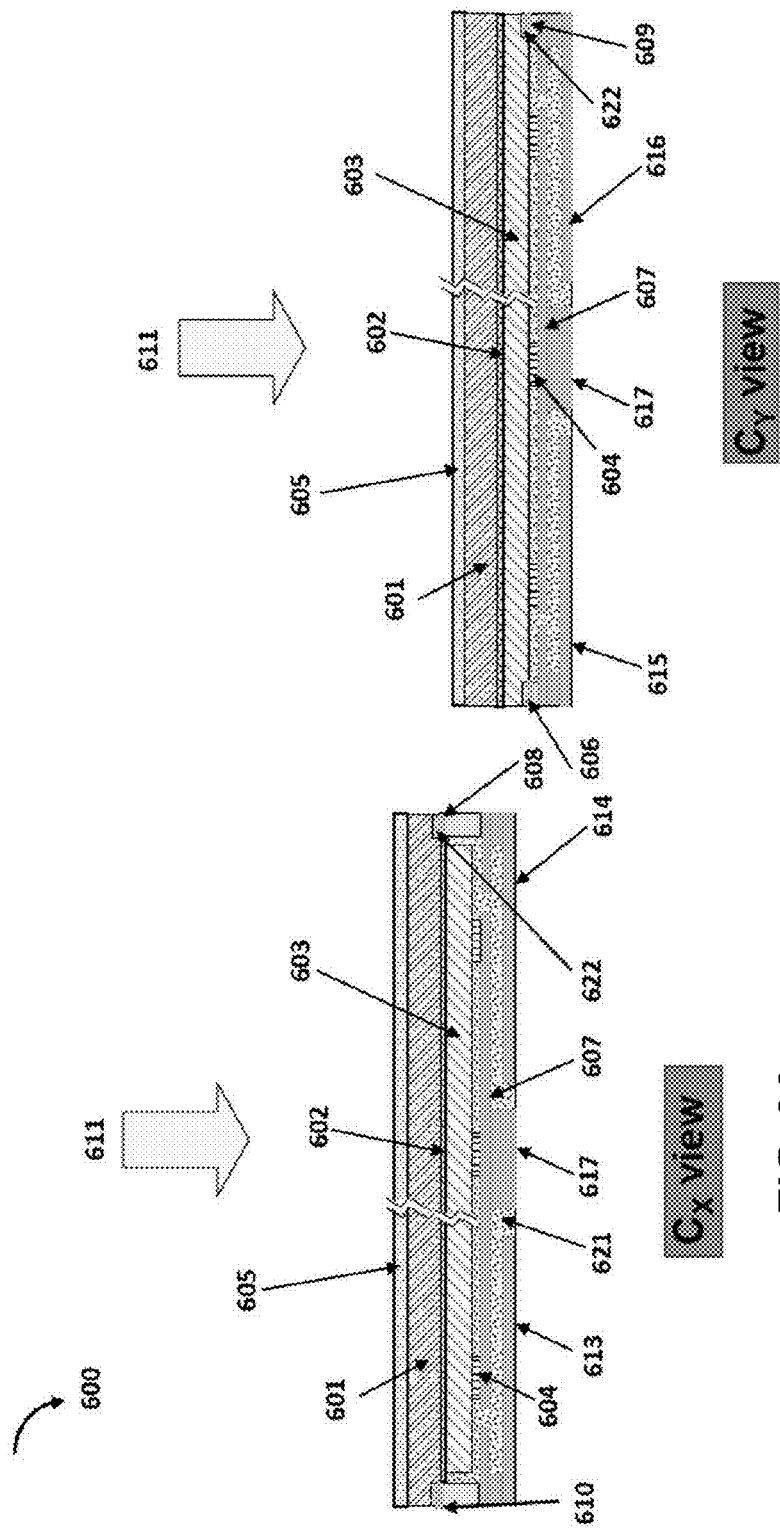
FIG. 6a and FIG. 6b illustrate Cx and Cy cross sectional views of a detector, according to an embodiment of the present disclosure.

For the embodiments 500 and 600 of FIGS. 5 and 6, which illustrate a detector suitable for dual-band detection of SWIR and MWIR light, the currents to the four signal contacts flow through n-type materials that have fairly high electrical conductivity, because the electrons have high mobility. For the embodiments of FIG. 7 through FIG. 9, the currents to the four signal contacts flow through heavily doped p-type materials, which although having lower carrier mobility than n-type materials can have high electrical conductivity because of its high doping level.

The thickness of Absorber 1 should be sufficiently large to enable most (e.g., >90-95%) of the Band 1 light to be absorbed in a single pass through that region. In general, a thickness of 2 μm to 5 μm may be acceptable, although even greater thickness could be used, too. Any Band 1 light not absorbed by Absorber 1 could then become absorbed by Absorber 2 and result in currents from the Absorber 2 region that do not represent the Band 2 light. The thickness of Absorber 2 preferably is sufficiently large to enable most (e.g., >90-95%) of the Band 2 light to be absorbed in two passes through that region. In general, a thickness of 3 μm to 5 μm may be acceptable, although even greater thickness could be used, too. As illustrated in FIGS. 6 and 8, the metal reflectors are separated from the absorber materials by a spacer of dielectric material 621, 821 that has sufficiently large thickness (e.g., >0.2 μm) and sufficiently low refractive index (e.g., <2.4) to reduce the absorption of the Band 2 light by those metal reflectors. The term "minimally" absorbing is used in the context of what amount of absorption is acceptable in the 'other' band that is not supposed to be absorbed by this absorber. The acceptable amount of absorbed light in the other band depends on the specific application. For J example, having absorption below 25% in the wrong band may be acceptable for some applications. For other applications, this wrong band absorption may have to be less than 5%.

The specific compositions of the materials in the detector structure can be adjusted to achieve absorption of light over a desired range of wavelengths at a given operating temperature. This material can be grown on substrate materials such as GaSb and GaAs. The materials do not need to have the same lattice constant as that of the substrate. In some embodiments, it is preferable that the lattice constants of the materials in the various layers and regions of the detector structure are similar.

Although binary, ternary and quaternary bulk materials have been described in the examples discussed above, it also is possible to use superlattices of several binary materials for the various layers and regions of the detector structure. For example, short-period superlattices of InAs/GaSb can be used to achieve absorbers that absorb light at wavelengths ranging from MWIR bands to LWIR bands.

Figure 10:
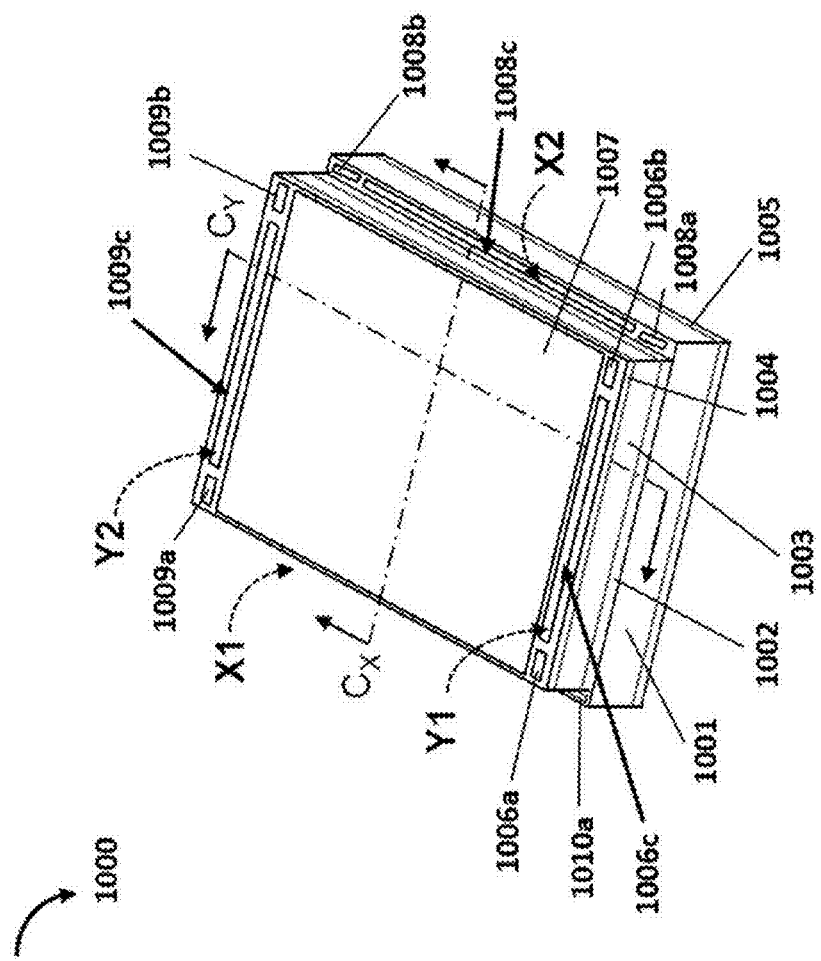
FIG. 10 illustrates an alternate dual-band lateral effect position sensing detector, according to an embodiment of the present disclosure.

The embodiment 1000 of FIG. 10 illustrates an alternate architecture for the detector that also can provide position location of a spot of illuminating light along two axes defined by the detector. In this embodiment, the position location can be provided separately for light of the two wavelength bands. Thus, even when the illuminating spot contains light in only one wavelength band, the detector still can locate that spot. In FIG. 10, the absorber-1 is represented by 1001, the absorber 2 by 1003, the barrier layer by 1002, the collector layer by 1004, the buffer layer by 1005, the common contact layer by 1007, and the signal contacts by 1010a, 1008a, 1008b, 1008c, 1009a, 1009b, 1009c, 1006a, 1006b and 1006c. (Signal contacts 1010b and 1010c are hidden from view in this drawing). The detector separates each group of signal contact into three portions. For example, two of those portions (1009a, 1006a) and (1009b, 1006b) are located near corners of the detector, as shown in the FIG. 10. The other portions (1009c, 1006c) are located between those corner-located portions and near an edge of the detector. The X1 and X2 contacts (1010c and 1008c, respectively) and Y1 and Y2 contacts (1006c and 1009c, respectively) are as discussed earlier.

Four contacts 1010a, 1010b, 1008a, 1008b located near the four corners of Absorber 1 are coupled to Absorber 1. Likewise, four contacts 1006a, 1006b, 1009a, 1009b located near the four corners of Absorber 2 are coupled to Absorber 2. The four contacts associated with each absorber in combination with that absorber, which acts like a four-part resistive divider, can function like a quadrilateral position sensing detector. The detector 1000 of FIG. 10 thus has two quadrilateral position sensing detectors that are stacked above each other V and that are spatially aligned with each other, with one quadrilateral position sensing detector sensing light of Band 1 and the other quadrilateral position sensing detector sensing light of Band 2. When used as quadrilateral position sensing detectors, the centroid of the Band 1 light and the centroid of the Band 2 light could be at different spatial locations. The detector 1000 can separately locate the Band 1 light and the Band 2 light. Each of the corner contacts (e.g., 1006a, 1006b, 1009a, 1009b) would be connected to a input of an electronic circuit that processes the signal currents from those contacts and determines the location of the spot of light sensed by the associated absorber layer.

Though figures are illustrated for a rectangular detector, the detector as well as the Absorber 1, Absorber 2 and the barrier can be of any shape, such as any polygon, a square or even a circle. The detectors can also be cascaded along the X and Y directions to form an array of detectors supporting different wavelength absorptions on one or more detectors. Such array of detectors can detect optical intensities on several bands from one or more incident light and can also detect the locations of multiple light sources. Such an array of detectors can be fabricated on a monolithic substrate. Any single layer can also contain more than one Absorber type and in which case, each Absorber type will have its own set of electrodes. Additional Absorber layers can also be stacked vertically to detect intensities of light at additional wavelength bands or to locate multiple sources. Also, each Absorber can absorb more than one wavelength (such as a band of wavelengths) and in which case, the sensor detection will be for the band as opposed to a single wavelength. Additionally, the light or radiation sources that are detected can be in any wavelength band (SWIR, MWIR or LWIR).

The various embodiments of the disclosed sensor can be part of an optical angle-of-arrival sensor that determines the incidence angle of the dual-band light produced by a transient event (such as a muzzle flash) or a rapidly moving object (such as a projectile or missile). Such events and moving objects produce MWIR radiation because of the heat and gas-compression generated and also could produce MWIR radiation as a result of chemical reactions (e.g., exhaust gas from gun blasts or fuel combustion). The sensor can locate and track the object producing the dual-band light. The sensor also can determine the time-variation of the light in each wavelength band. Different objects that could produce the dual-band light generally would have different characteristic time variations of the intensities in the two bands. Thus, this sensor can not only locate the light but also provide information about the source of that light. This sensor also can provide information on how the source of light changes as its position changes. For example, the source of light could change from having substantial contribution from chemical combustions reactions to having more contributions from heating and J compression effects.

The concepts represented here for the dual band sensor can be extended to three v bands and beyond by stacking up the properly chosen absorbers and with appropriate barriers. The mathematics can be extended as a system of matrix equations to identify intensities of light at multi-bands as well as to locate and track multiple sources. This disclosure includes such extensions to the concepts presented here.

Modifications, additions, or omissions may be made to the systems, apparatuses, and methods described herein without departing from the scope of the invention. The components of the systems and apparatuses may be integrated or separated. Moreover, the operations of the systems and apparatuses may be performed by more, fewer, or other components. The methods may include more, fewer, or other steps. Additionally, steps may be performed in any suitable order. As used in this document, "each" refers to each member of a set or each member of a subset of a set.

To aid the Patent Office, and any readers of any patent issued on this application in interpreting the claims appended hereto, applicants wish to note that they do not intend any of the appended claims or claim elements to invoke paragraph 6 of 35 U.S.C. Section 112 as it exists on the date of filing hereof unless the words "means for" or "step for" are explicitly used in the particular claim.

What is claimed is:

1. A multi-band optical detector comprising:
   a first absorber region that absorbs incident light of a first wavelength and is electrically coupled to a pair of first electrical contacts located at any two opposite edges of the first absorber;
   a second absorber region that absorbs incident light of a second wavelength and is electrically coupled to a pair of second electrical contacts located at two opposite edges of the second absorber, wherein the second electrical contacts are not on the same edges of the detector as the first electrical contacts, and
   a barrier that is between the first absorber and the second absorber and that blocks a flow of a first type of electrical charge carriers while allowing a flow of a second type of electrical charge carriers.

2. The multi-band optical detector of claim 1, further comprising a buffer layer on the side of the second absorber facing the incident light, wherein the buffer layer is transparent to the incident light of the first wavelength and the incident light of the second wavelength; the buffer layer being arranged for blocking the flow of both types of electrical charge carriers generated in the second absorber region.

3. The multi-band optical detector of claim 1, further comprising a first collector region on the side of the first absorber layer opposite to the side of the first absorber layer facing the incident light.

4. The multi-band optical detector of claim 3, further comprising a second collector region on the side of the second absorber layer facing the incident light.

5. The multi-band optical detector of claim 4, wherein the pair of first electrical contacts is on the first collector region and the pair of second electrical contacts is on the second collector region.

6. The multi-band optical detector of claim 3, further comprising a common electrical contact on the first collector region.

7. The multi-band optical detector of claim 4, further comprising a common electrical contact on the first absorber region.

8. The multi-band optical detector of claim 3, wherein the first collector region is transparent to incident light of the first wavelength.

9. The multi-band optical detector of claim 3, wherein the first collector region comprises p-type material.

10. The multi-band optical detector of claim 1, wherein the pair of first electrical contacts is in contact with the first absorber.

11. The multi-band optical detector of claim 1, wherein the pair of first electrical contacts and the pair of second electrical contacts span along most of the edge length where they are located.

12. The multi-band optical detector of claim 1, wherein each first electrical contact of the pair of first electrical contacts comprises two corner electrical contacts and a center electrical contact and each second electrical contact of the pair of second electrical contacts comprises two corner electrical contacts and a center electrical contact.

13. The multi-band optical detector of claim 1, wherein the first absorber region, the second absorber region and the barrier are polygon in shape.

14. The multi-band optical detector of claim 1, wherein the first absorber region, the second absorber region and the barrier are circular in shape.

15. The multi-band optical detector of claim 1, wherein the first absorber region comprises n-type material.

16. The multi-band optical detector of claim 3, wherein the second absorber region comprises n-type material.

17. The multi-band optical detector of claim 4, wherein the second absorber region comprises p-type material.

18. The multi-band optical detector of claim 1, wherein the first absorber region is GaInAsSb.

19. The multi-band optical detector of claim 1, wherein the second absorber region is InAsSb.

20. The multi-band optical detector of claim 1, wherein the barrier is one or more of p-GaAlAsSb and n-AlInAsSb.

21. The multi-band optical detector of claim 3, wherein the buffer is AlAsSb.

22. The multi-band optical detector of claim 3, wherein the collector region is one or more of p-GaInAsSb, p+-GaAlAsSb and p+-AlInSb.

23. A multi-band position sensor for incident light comprising:
a first absorber region that absorbs incident light of a first wavelength and is electrically coupled to a pair of first electrical contacts located at any two opposite edges of the first absorber;
a second absorber region that absorbs incident light of a second wavelength and is electrically coupled to a pair of second electrical contacts located at two opposite edges of the second absorber, wherein the second electrical contacts are not on the same edges of the sensor as the first electrical contacts;
a barrier that is between the first absorber and the second absorber and that blocks a flow of a first type of electrical charge carriers while allowing a flow of a second type of electrical charge carriers; and
an electrical circuit that is connected to the pair of first electrical contacts and the pair of second electrical contacts and computes the position of the incident light.

24. The multi-band position sensor of claim 23, further comprising an optical element that focuses the incident light onto the first absorber region and the second absorber region.

25. The multi-band position sensor of claim 23, wherein the pair of first electrical contacts is electrically coupled to a first subtracting circuit of the electrical circuit and the pair of second electrical contacts is electrically coupled to a second subtracting circuit of the electrical circuit.

26. The multi-band position sensor of claim 23, wherein the pair of first electrical contacts is electrically coupled to a first adding circuit of the electrical circuit.

27. The multi-band position sensor of claim 23, wherein the pair of second electrical contacts is electrically coupled to a second adding circuit of the electrical circuit.

28. The multi-band position sensor of claim 23, wherein the pair of first electrical contacts and the pair of second electrical contacts span along most of the edge length where they are located.

29. The multi-band position sensor of claim 23, wherein the first electrical contacts and the second electrical contacts comprise of two corner electrical contacts and a center electrical contact for one or more edges where they are located.

30. The multi-band position sensor of claim 23, further comprising a first collector region on the side of the first absorber layer opposite to the side of the first absorber layer facing the incident light.

31. The multi-band position sensor of claim 30, further comprising a common contact electrically coupled to the first collector region, wherein the common contact is coupled to a common path of the electrical circuit; and the common contact produces an electrical current indicative of the holes generated in the first absorber layer and of the holes generated in the second absorber layer.

32. The multi-band position sensor of claim 30, further comprising a second collector region on the side of the second absorber layer and on the side of the second absorber layer facing the incident light; the first collector region producing an electrical current indicative of the holes generated in the first absorber layer and the second collector region producing an electrical current indicative of the holes generated in the second absorber layer.

33. The multi-band position sensor of claim 26, wherein the pair of second electrical contacts is electrically coupled to a second adding circuit of the electrical circuit and wherein the electrical circuit uses the first adding circuit to compute intensities of the first wavelength of incident light absorbed by the detector and uses the second adding circuit to compute intensities of the second wavelength of incident light that is absorbed by the sensor.

34. A multi-band optical detector integrated circuit chip comprising:
   an array of detectors in rows and/or columns having the same substrate, wherein the detector comprises:
   a first absorber region that absorbs incident light of a first wavelength and is electrically coupled to a pair of first electrical contacts located at any two opposite edges of the first absorber;
   a second absorber region that absorbs incident light of a second wavelength and is electrically coupled to a pair of second electrical contacts located at two opposite edges of the second absorber, wherein the second electrical contacts are not on the same edges of the detector as the first electrical contacts; and
   a barrier that is between the first absorber and the second absorber and that blocks a flow of a first type of electrical charge carriers while allowing a flow of a second type of electrical charge carriers.

35. A multi-band position sensor integrated circuit chip for locating multiple sources of incident light comprising:
   an array of detectors in rows and/or columns having the same substrate, wherein the detector comprises:
   a first absorber region that absorbs incident light of a first wavelength and is electrically coupled to a pair of first electrical contacts located at any two opposite edges of the first absorber;
   a second absorber region that absorbs incident light of a second wavelength and is electrically coupled to a pair of second electrical contacts located at two opposite edges of the second absorber, wherein the second electrical contacts are not on the same edges of the detector as the first electrical contacts;
   a barrier that is between the first absorber and the second absorber and that blocks a flow of a first type of electrical charge carriers while allowing a flow of a second type of electrical charge carriers; and
   an electrical circuit that is connected to the first electrical contacts and the second electrical contacts and computes the position of the incident light for the first wavelength and the second wavelength.

36. The multi-band optical detector of claim 1, further comprising a reflector positioned on a side of the second absorber opposite the first absorber, configured for reflecting light of the second wavelength transmitted through the second absorber onto the second absorber.

37. The multi-band optical detector of claim 36, wherein the reflector is a metal reflector.

38. The multi-band optical detector of claim 10, wherein the pair of second electrical contacts is in contact with the second absorber.

39. The multi-band optical detector of claim 1, wherein the first absorber region absorbs at least 90% of the incident light of the first wavelength, and the second absorber region absorbs at least 90% of the incident light of the second wavelength.

40. The multi-band position sensor of claim 23, wherein the pair of first electrical contacts is in contact with the first absorber and the pair of second electrical contacts is in contact with the second absorber.

41. The multi-band optical detector integrated circuit chip of claim 34, wherein the pair of first electrical contacts is in contact with the first absorber and the pair of second electrical contacts is in contact with the second absorber.

42. The multi-band position sensor integrated circuit chip of claim 35, wherein the pair of first electrical contacts is in contact with the first absorber and the pair of second electrical contacts is in contact with the second absorber.

43. The multi-band optical detector of claim 1, wherein the two opposite edges of the first absorber are two opposite edges of the detector.

44. The multi-band position sensor of claim 23, wherein the two opposite edges of the first absorber are two opposite edges of the sensor.

45. The multi-band optical detector integrated circuit chip of claim 34, wherein the two opposite edges of the first absorber are two opposite edges of the detector.

46. The multi-band position sensor integrated circuit chip of claim 35, wherein the two opposite edges of the first absorber are two opposite edges of the detector.

* * * * *